United States Patent [19]

Kamath et al.

[11] Patent Number: 5,028,561
[45] Date of Patent: Jul. 2, 1991

[54] METHOD OF GROWING P-TYPE GROUP II-VI MATERIAL

[75] Inventors: G. Sanjiv Kamath, Malibu; Owen K. Wu, Westlake, both of Calif.

[73] Assignee: Hughes Aircraft Company, Los Angeles, Calif.

[21] Appl. No.: 366,827

[22] Filed: Jun. 15, 1989

[51] Int. Cl.$^5$ .......................................... H01L 21/203
[52] U.S. Cl. ........................... 437/105; 148/DIG. 41; 148/DIG. 64; 148/DIG. 169; 437/971
[58] Field of Search .................. 148/DIG. 18, 23, 40, 148/41, 64, 169; 156/610-614; 427/248.1, 255.1; 437/81, 88, 105, 107, 108, 936, 959, 971

[56] References Cited

U.S. PATENT DOCUMENTS

| | | | |
|---|---|---|---|
| 4,159,919 | 7/1979 | McFee et al. | 437/105 |
| 4,392,453 | 7/1983 | Luscher | 437/105 |
| 4,411,728 | 10/1983 | Sakamoto | 437/105 |
| 4,735,910 | 4/1988 | Mitsuyu et al. | 437/22 |
| 4,847,216 | 7/1989 | d'Avitaya et al. | 156/612 |

FOREIGN PATENT DOCUMENTS 0079630 4/1987 Japan ................................. 437/105

OTHER PUBLICATIONS

Park et al., "Antimony-Doped ZnSe Grown by Molecular-Beam Epitaxy", J. Appl. Phys., 63(8), Apr. 15, 1988, pp. 2851-2853.
M. L. Wroge et al., "Controlled P-Type Impurity Doping of $Hg_{1-x}Cd_xTe$ During Growth by Molecular-Beam Epitaxy", J. Vac. Sci. Technol., A6(4), Jul./Aug. 1988, pp. 2826-2829.
S. Hwang et al., "Properties of Doped CdTe Films Grown by Photoassisted Molecular-Beam Epitaxy", J. Vac. Sci. Technol., A6(4), Jul./Aug. 1988, pp. 2821-2825.
M. Boukerche et al., "The Doping of Mercury Cadmium Telluride by Molecular-Beam Epitaxy", J. Vac. Sci. Technol., A6(4), Jul./Aug. 1988, pp. 2830-2833.
J. P. Faurie et al., "Latest Developments in the Growth of $Hg_{1-x}Cd_xTe$ and CdTe-HgTe Superlattices by Molecular Beam Epitaxy", J. Vac. Sci. Technol., A, vol. 1, No. 3, Jul.-Sep. 1983, pp. 1593-1597.
J. P. Faurie et al., "Molecular Beam Epitaxy of II"VI Compounds: $Hg_{1-x}Cd_xTe$", J. Cryst. Growth, vol. 54, No. 3, 1981, pp. 582-585.

Primary Examiner—Olik Chaudhuri
Assistant Examiner—William Bunch
Attorney, Agent, or Firm—Paul M. Coble; W. K. Denson-Low

[57] ABSTRACT

P-type doping of a molecular beam epitaxy (MBE) grown substrate composed of a Group II-VI combination is accomplished by forming a flux from a Group II-V combination, and applying the flux to the substrate at a pressure less than about $10^{-6}$ atmosphere. The Group II material is selected from Zn, Cd, Hg and Mg, the Group V material from As, Sb and P, and the Group VI material from S, Se and Te. The Group II-V dopant combination is preferably provided as a compound formed predominantly from the Group II material, and having the formulation $X_3Y_2$, where X is the Group II material and Y is the Group V material. The doping concentration is controlled by controlling the temperature of the Group II-V combination. Metal vacancies in the lattice structure are tied up by the Group II constituent of the dopant combination, leaving the Group V dopant available to enter the Group VI sublattice and produce a p-type doping.

18 Claims, 2 Drawing Sheets

METHOD OF GROWING P-TYPE GROUP II-VI MATERIAL

BACKGROUND OF THE INVENTION

1. Field of the Invention

This invention relates to the p-type doping of optical materials formed from Group II-VI combinations in general, and more particularly to the p-type doping of HgCdTe using molecular beam epitaxy.

2. Description of the Related Art

The ability to impart a p-type doping to HgCdTe is critical to the production of junction structures which are at the heart of infrared (IR) detectors. However, a suitable doping technique using molecular beam epitaxy that is compatible with preferred fabrication processes for IR detectors has not previously been found.

HgCdTe is difficult to prepare for use in detection devices by either bulk or epitaxial techniques. The most commonly used epitaxial growth process for this material has been liquid phase epitaxy. Although high performance infrared detectors have been realized with growth by liquid phase epitaxy, the technique cannot produce abrupt hetero-junctions and superlattices required for advanced opto-electronic devices. A review of various growth techniques is provided in J. P. Faurie, et al., "Latest Developments in the Growth of $Hg_{1-x}Cd_xTe$ and CdTe—HgTe Superlattices by Molecular Beam Epitaxy", J. Vac. Sci. Technol. A, Vol. 1, No. 3, July/September 1983, pages 1593–97.

The molecular beam epitaxy (MBE) technique, on the other hand, is suitable for the growth of high quality epilayers, abrupt hetero-junctions and alternate microstructures such as superlattices. This technique is described in J. P. Faurie, et al., "Molecular Beam Epitaxy of II-VI Compounds: $Hg_{1-x}Cd_xTe$", J. Cryst. Growth, Vol. 54, No. 3, pages 582–585, 1981.

MBE is a vacuum deposition process. Several effusion cells are used, each cell comprising an electrically heated crucible containing one of the substances of the compound to be grown. Upon heating, the cells produce atomic or molecular beam fluxes of mercury, cadmium, tellurium or CdTe. The fluxes are directed onto the surface of the substrate, where they react with each other and produce an epitaxial layer.

Arsenic (As) is commonly used as a p-type dopant, although antimony (Sb) and Phosphorus (P) are also available for this purpose. However, it has been previously discovered that these Group V elements can also act as n-type dopants in HgCdTe, rather than p-type dopants, when they are incorporated using the MBE process. See M. Boukerche, et al., "The Doping of Mercury Cadmium Telluride Grown By Molecular Beam Epitaxy", J. Vac. Sci. Technol. A, Vol. 6, No. 4, July/August, 1988, pages 2830–33. The n-type doping is believed to result from the occupation of Hg vacancies in the metal lattice by As. It is difficult to adjust the vapor pressures of Cd and Hg to assure that all positions in the metal lattice are filled. Since Te has a higher sticking coefficient than Hg, there will be a tendency towards an excess of Hg lattice vacancies. The Hg vacancies facilitate the substitution of As atoms in the metal lattice for Hg, preventing them from exclusively entering into the Te sublattice in the alloy. This effect is enhanced by the fact that As and Te form a compound similar to the one formed between Cd and Te.

As has a deficiency of one electron compared to Te, and therefore becomes a p-type dopant when substituted into the Te position in the lattice. However, As has an excess of three electrons compared to Group II materials such as Hg and Cd, and therefore acts as an n-type dopant when bound into the Hg vacancies in the Hg-Cd (metal) lattice in the HgCdTe layer. This phenomenon has effectively precluded the practical use of As and other Group V elements as p-type dopants for HgCdTe in connection with normal MBE.

One approach towards a solution to this problem might be to increase the Hg and/or Cd vapor pressure to eliminate, or at least reduce, the metal lattice vacancies. However, increasing the vapor pressure much above $10^{-6}$ atmosphere imbalances the stoichiometry, and in general would exceed the low vapor pressure regime required for effective MBE. Higher vapor pressures cause the molecular beams to scatter, and reduces the control achievable over the materials reaching the substrate.

Another approach has been to avoid the use of As altogether, and instead employ silver (Ag, Group I). See, M. L. Roge, et al., "Controlled P-Type Impurity Doping of $Hg_{1-x}Cd_xTe$ During Growth By Molecular-Beam Epitaxy", J. Vac. Sci. Technol. A, Vol. 6, No. 4, July/August, 1988, pages 2826–29. While avoiding the n-type doping problem, this technique also eliminates the distinct advantages of As used as a dopant, especially because Ag is a fast diffuser in II-VI compounds.

The use of photoassisted doping with As has been another avenue of exploration to overcome the n-type doping problem. This involves modifying the normal MBE system to permit illumination of the substrate during the growth process and is described, for example, in S. Hwang, et al., "Properties of Doped CdTe Films Grown By Photoassisted Molecular-Beam Epitaxy", J. Vac. Sci. Technol. A, Vol. 6, No. 4, July/August, 1988, pages 2821–25. This technique adds an extra degree of complexity to the system, and has not yet been demonstrated to be fully effective in the alloy system.

The situation has been described thus far in terms of HgCdTe. It should be understood that similar considerations apply to HgTe and CdTe. Similar doping by Group V elements will also be encountered with other Group II-VI combinations. In general, Zn, Cd, Hg and Mg from Group II can be combined with S, Se, and Te from Group VI and are suitable for MBE fabrication techniques, the exact combination selected depending upon the desired bandgap and the kinetics of growth and dopant incorporation in the lattice.

SUMMARY OF THE INVENTION

The present invention discloses a method for doping a Group II-VI combination with a Group V dopant to achieve p-type doping, with the use of conventional MBE equipment without photo or ion assist. The fabrication is accomplished at normal MBE pressures and temperatures, with the Group V dopant undergoing an orderly occupation of the Group VI lattice position. The effective dopant deposition rate, and thereby the degree of doping, may be accurately controlled by simple temperature control.

To accomplish these goals, an MBE flux is formed from a combination of a Group V dopant and a Group II material. The Group V dopant can be selected from As, Sb and P, while the Group II material is selected from Zn, Cd, Hg and Mg. The flux is applied to a substrate during MBE growth at a pressure less than about $10^{-6}$ atmosphere. The Group II flux occupies and ties up the normal metal vacancies in the metal lattice (typically Hg for a HgCdTe growth layer). As a result, the Group V dopant goes into the Group VI lattice, where it acts as a p-type dopant.

The Group II-VI flux is preferably produced from a compound in which the Group II material predominates. In general, the compound will have the formulation $X_3Y_2$, where X is the Group II material and Y is the Group V material. The doping concentration is easily controlled by controlling the temperature of the compound from which the dopant flux is derived.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
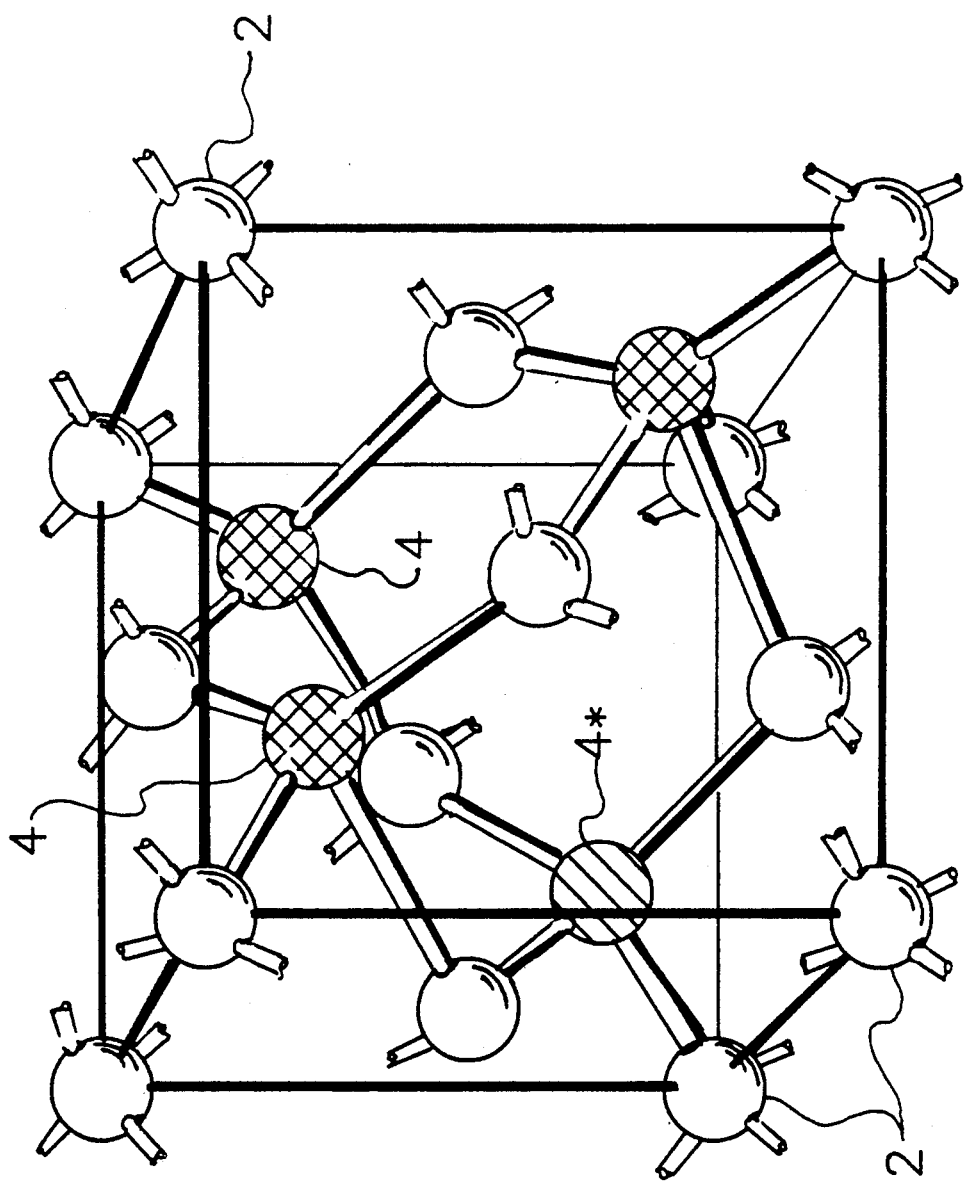
FIG. 1 is a simplified illustration of the lattice structure of an MBE grown Group II-VI material which is to be p-doped in accordance with the invention.

The lattice structure of an epitaxially grown HgCdTe layer is illustrated in FIG. 1 as a basic cubic structure, although other models could be used depending upon where one enters the lattice. The lattice is essentially two interwoven face-centered cubes each having either Cd, Hg or Te atoms. The proportion of Cd to Hg is controlled by the selection of materials for the molecular beams used to grow the structure, and can vary from all Cd to all Hg or various ratios in between. The combined Hg/Cd proportion is substantially equal to the proportion of Te.

A full cube of the Group VI element Te occupies the sites 2, while a portion of a cube of Cd and/or Hg atoms is shown occupying sites 4. Bonds are established from each corner site and face-centered site to other sites in the cube and also to adjacent cubes. A metal vacancy is indicated by a shaded circle at site 4*; this will generally correspond to an Hg site.

Figure 2:
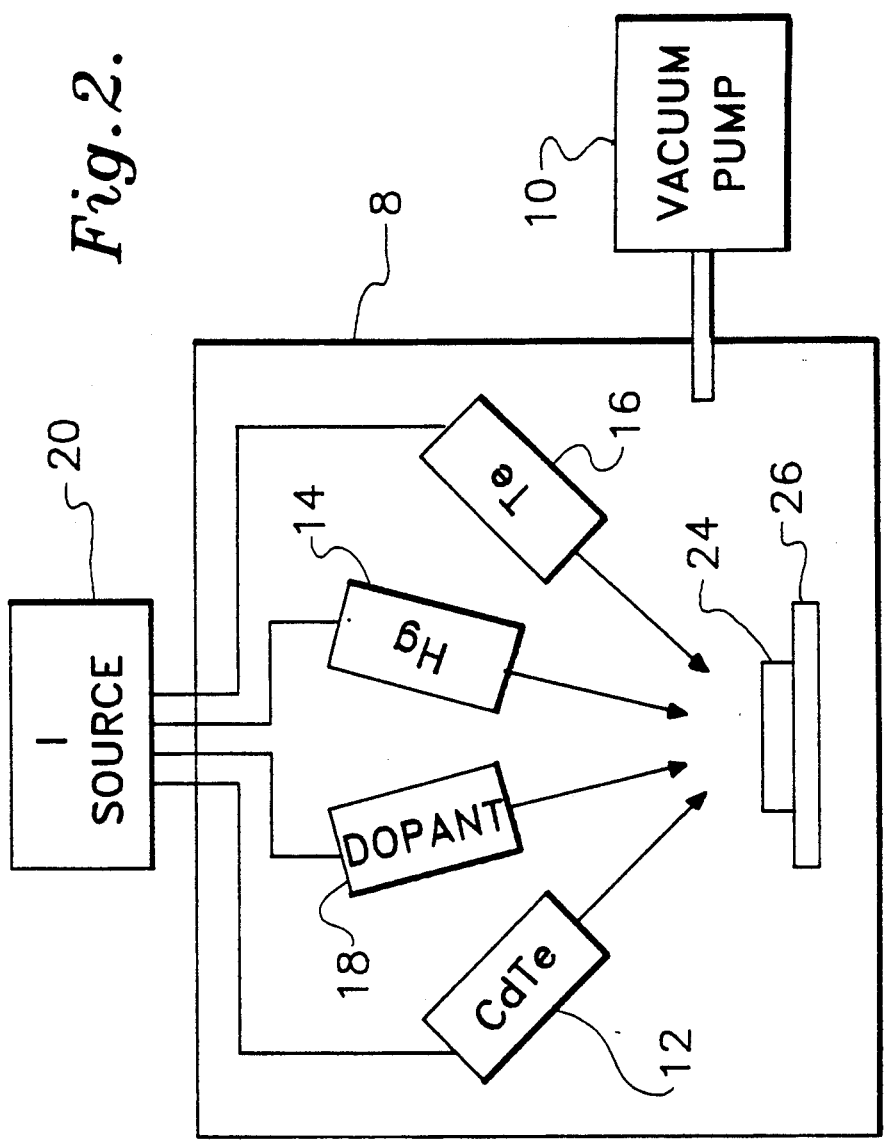
FIG. 2 is a schematic diagram illustrating an MBE apparatus used to practice the invention.

As noted above, the Hg vacancies tend to tie up some As or other Group V dopants, preventing them from entering the Te sublattice and resulting in n-type rather than p-type doping. This problem is solved in a unique but simple fashion by the present invention with the use of a conventional MBE chamber, illustrated in FIG. 2. The chamber 8 is maintained at a low pressure of less than $10^{-6}$ atmosphere, and preferably less than about $10^{-7}$ atmosphere, by a vacuum pump 10. Flux sources are provided in a number of different crucibles within the chamber. For HgCdTe, four crucibles are generally used. One crucible 12 contains CdTe, another 14 contains Hg, a third crucible 16 contains Te, while a fourth crucible 18 contains the dopant material. The crucibles are individually heated by electrical currents from a current source 20 to produce vapor fluxes from their respective materials. The fluxes 22 are directed onto a substrate 24 being epitaxially grown on a platform 26 in a conventional MBE fashion.

In accordance with the invention, the dopant flux is derived from a combination of a desired Group V dopant material and a Group II material, specifically either Zn, Cd, Hg or Mg. The vacant metal lattice position 2* is more electro positive than the Group VI sites 4, and therefore prefers the Group II over the Group V component of the dopant combination. Thus, the Group II portion of the dopant flux tends to tie up the vacant metal lattice sites, leaving the Group V dopant free to enter the desired Group VI lattice and establish a p-type doping. To enhance this effect, the proportion of Group II material in the dopant source is preferably greater than that of the Group V dopant material.

The Group V dopants that can be used with the invention are arsenic (As), antimony (Sb) and phosphorus (P). Appropriate compounds are available with these materials that have the low vapor pressure required for MBE. Of the other Group V materials, nitrogen is normally not used for doping, while bismuth is too metallic. While the chemical properties of phosphorus are suitable for its use with the invention, phosphorus must be handled carefully because it catches fire easily.

Any of the Group II metal atoms may be used to accompany the dopant atoms in the dopant flux. These are zinc (Zn), cadmium (Cd), mercury (Hg), and magnesium (Mg).

The dopant combination is preferably provided as a compound having the chemical formulation $X_3Y_2$, where X is the Group II material and Y is the Group V material. This gives a predominance to the Group II material, and helps to ensure that most of the Group II vacancies in the lattice are tied up and cannot divert the dopant atoms from the Group VI lattice sites.

For HgCdTe growth, $Cd_3As_2$ is the preferred dopant compound. While $Hg_3As_2$ also exists, Hg has a much lower sticking coefficient than Cd and therefore would not tie up as many Group II lattice vacancies. Furthermore, the Hg vapor pressure is much higher than that of Cd for the same temperature, making it difficult to use with MBE.

One of the distinct advantages of providing the Group V dopant in compound form together with a Group II material, rather than by itself, is an enhanced ability to control vapor pressures and thus doping concentrations. With the dopants in their elemental forms, small changes in temperature will provide very large changes in vapor pressure, whereas the dependence of vapor pressure upon temperature for the Group II-V compounds is much lower. Thus, the dopant vapor pressure can be much more precisely controlled for the II-V compounds than for the elemental dopants.

Various other cadmium-arsenic dopant compounds are available, such as CdAs and $CdAs_2$. While these would work with the present invention to a certain extent, the higher ratio of the Group II material in $Cd_3As_2$ is preferred because of its tendency to tie up more Group II lattice vacancies. Other examples of possible dopant compounds, not exhaustive, are $Cd_3Sb_2$ and $Cd_4Sb_3$ (with $Cd_3Sb_2$ preferred), $Cd_3P_2$, $Cd_6P_7$ and $CdP_2$ (with $Cd_3P_2$ preferred), $Cd_3As_2$, $Zn_3P_2$, $Zn_3Sb_2$, $Mg_3As_2$, $Mg_3P_2$, $Mg_3Sb_2$, etc.

The dopant compounds are generally heated to several hundred degrees below their melting points. To make the dopant pressure easily controllable, the compound's melting point should be greater than about 400°-500° C. $Cd_3As_2$ is generally heated to a temperature within the range of 150°-250° C., the higher end of the range being selected for a greater dopant vapor pressure and correspondingly greater dopant concentration. Operating temperature ranges for most Sb and P dopant compounds would be comparable.

There is an interesting contrast with MBE n-type doping in this area. N-type doping is normally accomplished with indium, the vapor pressure of which is much easier to precisely control by temperature settings than are the vapor pressures of elemental p-type dopants. Thus, the unique advantages of vapor pressure controllability derived from the use of II–V compounds rather than elemental dopants with the present invention are unique to p-type dopants.

Another advantage in using a Group II–V dopant source is believed to reside in the nature of the Group V particles reaching the substrate. The Group V species present in the flux of particles at the substrate in the very low pressure beam may be in the atomic state. If this is so, it is believed that the routing of the Group V particles to the Group VI lattice positions would be enhanced, thereby further enhancing the p-type characteristics of the deposited layer.

The invention is generally applicable to the growth and doping of Group II and VI materials comprising any mixture of one or two of the identified Group II materials with a Group VI material selected from sulphur (S), selenium (Se) or tellurium (Te). S has a high bandgap and is not often used, but can be employed to adjust the bandgap of the overall II–VI material.

With the described invention, the doping level can be successfully controlled on the order of $10^{15} cm^{-3}$. This range is particularly important for the fabrication of p-n junction devices using HgCdTe for infrared detector and communication devices. Since MBE growth offers a high degree of versatility in the control of composition, doping and surface morphology, the present invention is particularly important to MBE technology because it enables the use of this growth technique to meet the needs of infrared night vision and communication systems.

Figure 3:
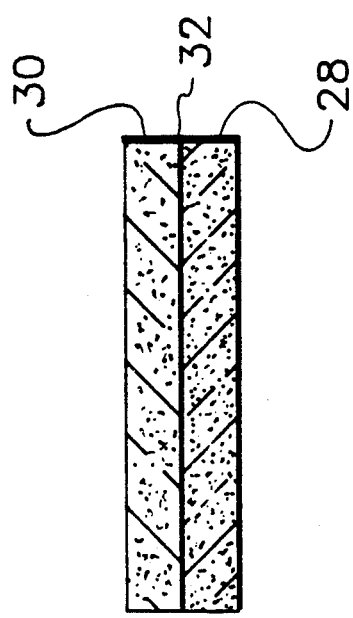
FIG. 3 is a sectional view of a p-n junction formed in accordance with the invention.

A simple p-n junction structure that can be implemented with the invention is illustrated in FIG. 3. A first layer 28 of Group II–VI material is first grown and doped by an MBE process. If it is doped p-type, the technique of the present invention is used; conventional n-type MBE doping techniques could be used if it is doped n-type. For example, with HgCdTe the layer would typically be doped with a $Cd_3As_2$ flux if p-type doping is desired, or directly with indium if n-type doping is sought. Upon the completion of the first layer 28, the dopant type is reversed, and the MBE process continued with the dopant heated to a suitable temperature for the desired dopant concentration. This will produce a second layer 30 which is of opposite type doping from layer 28, and meets layer 28 along a junction 32. The basic junction structure can be employed as a building block for any of a variety of devices in the IR detector and communications field.

The MBE technique is especially attractive because the layers can be grown at 180° C. or lower. Since the mobility of Hg atoms in the lattice increases rapidly at temperatures higher than 200° C., the low temperature growth possible by MBE is especially suitable to grow controlled stoichiometry alloy layers with sharp interfaces critical to the control of junctions in pn junction devices. The control is also important for superlattice growth because it tends to increase the sharpness of interfaces between successive layers by minimizing interdiffusion of the component atoms in the lattice at these interfaces.

While several illustrative embodiments of the invention have been described, numerous variations and alternate embodiments will occur to those skilled in the art, without departing from the spirit and scope of the invention. Accordingly, it is intended that, within the scope of the appended claims, the present invention may be practiced otherwise than as specifically described.

We claim:

1. A method of p-type doping a substance formed from a combination of at least one Group II material selected from the group consisting of Zn, Cd, Hg and Mg and a group VI material selected from the group consisting of S, Se and Te, the substance having a lattice structure with metal vacancies and a Group VI sublattice structure, comprising:

forming a flux from a combination of Group II and Group V materials, the Group II material being selected from the group consisting of Zn, Ce, Hg and Mg and the Group V material being selected from the group consisting of As, Sb and P, and applying said flux to the substance at a pressure less than about $10^{-6}$ atmosphere, the Group II material being present in the flux in a quantity sufficient to occupy metal vacancies in the lattice structure so that the Group V material in the flux enters the Group VI sublattice and establishes a p-type doping.

2. The method of claim 1, wherein the substrate comprises HgCdTe, and the flux is formed from a compound consisting of HgCd combined with one of said Group V materials.

3. The method of claim 2, wherein the combined proportion of Hg and Cd in the flux compound is substantially equal to the proportion of Te, the relative proportion of Hg is in the range $0 > x < 1$ and the relative proportion $1-x$ of Cd is in the range $1 < 1-x > 0$.

4. A method of p-type doping a substance formed from a combination of at least one Group II material selected from the group consisting of Zn, Cd, Hg and Mg and a Group VI material selected from the group consisting of S, Se and Te, comprising:

forming a flux from a combination of Group II and Group V materials, the Group II material being selected from the group consisting of Zn, Cd, Hg and Mg and the Group V material being selected from the group consisting of As, Sb and P, said combination of Group II and Group V materials being provided as a compound which is formed predominantly from the Group II material, and applying said flux to the substance at a pressure less than about $10^{-6}$ atmosphere.

5. The method of claim 4, wherein said compound has the formulation $X_3Y_2$, where X is the Group II material and Y is the Group V material.

6. A method of p-type doping a substance formed from a combination of at least one Group II material selected from the group consisting of Zn, Cd, Hg and Mg and a Group VI material selected from the group consisting of S, Se and Te, comprising:

forming a flux from a combination of Group II and Group V materials, the Group II material being selected from the group consisting of Zn, Cd, Hg and Mg and the Group V material being selected from the group consisting of As, Sb and P, applying said flux to the substance at a pressure less than about 10⁻⁶ atmosphere, and controlling the temperature of said combination of Group II and Group V materials to control the doping concentration.

7. A method of growing p-doped Group II–VI material, the material comprising a combination of at least one Group II material selected from the group consisting of Zn, Cd, Hg and Mg and a Group VI material selected from the group consisting of S, Se and Te, comprising:

growing a layer of the Group II–VI material by molecular beam epitaxy (MBE), said layer having a lattice structure with metal vacancies and a Group VI sublattice structure, forming a flux from a combination of Group II and Group V materials, the Group II material being selected from the group consisting of Zn, Cd, Hg and Mg and the Group V material being selected from the group consisting of As, Sb and P, and applying said flux to the layer of Group II–VI material simultaneously with the MBE growth of said layer, the Group II material being present in the flux in a quantity sufficient to occupy metal vacancies in the lattice structure so that the group V material in the flux enters the Group VI sublattice and establishes a p-type doping.

8. The method of claim 7, wherein the Group II–VI material comprises HgCdTe, and the flux is formed from a compound consisting of HgCd combined with one of said Group V materials.

9. The method of claim 8, wherein the combined proportion of Hg and Cd in the flux compound is substantially equal to the proportion of Te, the relative proportion of Hg is in the range $0>x<1$ and the relative proportion $1-x$ of Cd is in the range $1<1-x>0$.

10. A method of growing p-doped Group II–VI material, the material comprising a combination of at least one Group II material selected from the group consisting of Zn, Cd, Hg and Mg and a Group VI material selected from the group consisting of S, Se and Te, comprising:

growing a layer of the Group II–VI material by molecular beam epitaxy (MBE), forming a flux from a combination of Group II and Group V materials, the Group II material being selected from the group consisting of Zn, Cd, Hg and Mg and the Group V material being selected from the group consisting of As, Sb and P, said combination of Group II and Group V materials being provided as a compound which is formed predominantly from the Group II material, and applying said flux to the layer of Group II–VI material simultaneously with the MBE growth of said layer.

11. The method of claim 10, wherein said compound has the formulation $X_3Y_2$, where X is the Group II material and Y is the Group V material.

12. The method of growing p-doped Group II–VI material, the material comprising a combination of at least one Group II material selected from the group consisting of Zn, Cd, Hg and Mg and a Group VI material selected from the group consisting of S, Se and Te, comprising:

growing a layer of the Group II–VI material by molecular beam epitaxy (MBE), forming a flux from a combination of Group II and Group V materials, the Group II material being selected from the group consisting of Zn, Cd, Hg and Mg and the Group V material being selected from the group consisting of As, Sb and P, applying said flux to the layer of Group II–VI material simultaneously with the MBE growth of said layer, and controlling the temperature of said combination of Group II and Group V materials to control the doping concentration.

13. A method of forming a p-n junction device from a device material consisting of a combination of at least one Group II material selected from the group consisting of Zn, Cd, Hg and Mg and a Group VI material selected from the group consisting of S, Se and Te, comprising:

a) forming an n-doped layer of the device material with a lattice structure having metal vacancies and a Group VI sublattice structure, and b) forming a p-doped layer of the device material adjacent to said n-doped layer by:

i) growing a layer of the device material by molecular beam epitaxy (MBE), ii) forming a flux from a combination of Group II and Group V materials, the Group II material being selected from the group consisting of Zn, Cd, Hg and Mg and the Group V material being selected from the group consisting of As, Sb and P, and iii) applying said flux to said layer of device material simultaneously with the MBE growth of said layer, the Group II material being present in the flux in a quantity sufficient to occupy metal vacancies in the lattice structure so that the Group V material in the flux enters the Group VI sublattice and establishes a p-type doping, said n-doped and p-doped layers meeting at a junction.

14. The method of claim 13, wherein the device material comprises HgCdTe, and the flux is formed from a compound consisting of HgCd combined with one of said Group V materials.

15. The method of claim 14, wherein the combined proportion of Hg and Cd in said flux is substantially equal to the proportion of Te, the relative proportion X of Hg is in the range $0>x<1$ in each layer and the relative proportion $1-x$ of Cd is in the range $1<1-x>0$ in each layer.

16. A method of forming a p-n junction device from a device material consisting of a combination of at least one Group II material selected from the group consisting of Zn, Cd, Hg and Mg and a Group VI material selected from the group consisting of S, Se and Te, comprising:

a) forming an n-doped layer of the device material, and b) forming an p-doped layer of the device material adjacent to said n-doped layer by:

i) growing a layer of the device material by molecular beam epitaxy (MBE), ii) forming a flux from a combination of Group II and Group V materials, the Group II material being selected from the group consisting of Zn, Cd, Hg and Mg and the Group V material being selected from the group consisting of As, Sb and P, and iii) applying said flux to said layer of device material simultaneously with the MBE growth of said layer, said combination of Group II and Group V materials being provided as a compound which is formed predominantly from the Group II material, said n-doped and p-doped layers meeting at a junction.

17. The method of claim 16, wherein said compound has the formulation $X_3Y_2$, where X is the Group II material and Y is the Group V material.

18. A method of forming a p-n junction device from a device material consisting of a combination of at least one Group II material selected from the group consisting of Zn, Cd, Hg and Mg and a Group VI material selected from the group consisting of S, Se and Te, comprising:

a) forming an n-doped layer of the device material, and
b) forming an p-doped layer of the device material adjacent to said n-doped layer by:
 i) growing a layer of the device material by molecular beam epitaxy (MBE),
 ii) forming a flux from a combination of Group II and Group V materials, the Group II material being selected from the group consisting of Zn, Cd, Hg and Mg and the Group V material being selected from the group consisting of As, Sb and P,
 iii) applying said flux to said layer of device material simultaneously with the MBE growth of said layer, and
 iv) controlling the temperature of the compound to control the doping concentration, said n-doped and p-doped layers meeting at a junction.

* * * * *